United States Patent
Klingberg et al.

(10) Patent No.: US 7,411,449 B2
(45) Date of Patent: Aug. 12, 2008

(54) COMPOSITE POWER AMPLIFIER

(75) Inventors: Mats Klingberg, Enskede (SE); Richard Hellberg, Huddinge (SE)

(73) Assignee: Telefonaktiebolaget L M Ericsson (PUBL), Stockholm (SE)

(*) Notice: Subject to any disclaimer, the term of this patent is extended or adjusted under 35 U.S.C. 154(b) by 177 days.

(21) Appl. No.: 10/595,169

(22) PCT Filed: Sep. 21, 2004

(86) PCT No.: PCT/SE2004/001357

§ 371 (c)(1), (2), (4) Date: Mar. 16, 2006

(87) PCT Pub. No.: WO2005/031966

PCT Pub. Date: Apr. 7, 2005

(65) Prior Publication Data

US 2007/0080747 A1 Apr. 12, 2007

(30) Foreign Application Priority Data

Sep. 26, 2003 (SE) .................................. 0302586

(51) Int. Cl.
 H03F 3/68 (2006.01)
(52) U.S. Cl. .................................. 330/124 R; 330/295
(58) Field of Classification Search .................. None
 See application file for complete search history.

(56) References Cited

U.S. PATENT DOCUMENTS

| | | | | |
|---|---|---|---|---|
| 5,017,888 | A | * | 5/1991 | Meinzer ..................... 330/295 |
| 5,025,225 | A | | 6/1991 | Tajima et al. |
| 5,786,727 | A | | 7/1998 | Sigmon |
| 6,252,461 | B1 | | 6/2001 | Raab |
| 6,262,629 | B1 | | 7/2001 | Stengel |
| 6,472,934 | B1 | | 10/2002 | Pehlke |
| 7,071,775 | B2 | * | 7/2006 | Gailus et al. ............. 330/124 R |
| 7,221,219 | B2 | * | 5/2007 | Hellberg et al. ......... 330/124 R |
| 7,262,656 | B2 | * | 8/2007 | Shiikuma ................ 330/124 R |
| 7,279,971 | B2 | * | 10/2007 | Hellberg et al. ......... 330/124 R |
| 2003/0076166 | A1 | | 4/2003 | Hellberg |

OTHER PUBLICATIONS

Swedish Patent Office, International Search Report for PCT/SE2004/001357, dated Sep. 21, 2004.

* cited by examiner

Primary Examiner—Robert J. Pascal
Assistant Examiner—Alan Wong
(74) Attorney, Agent, or Firm—Roger Burleigh

(57) ABSTRACT

A PAMELA-type of composite power amplifier is configured in such a way that a single power amplifier is operated at low output voltage amplitudes by prohibiting a pair of outphasing power amplifiers to produce any current. Preferably, at output voltage amplitudes above the maximum voltage of the single power amplifier is to be reached, the pair of outphasing power amplifiers is taken into operation providing currents phase shifted by substantially 180 degrees. When also the outphasing power amplifiers reach their maximum voltages, an outphasing operation is performed.

20 Claims, 12 Drawing Sheets

PRIOR ART

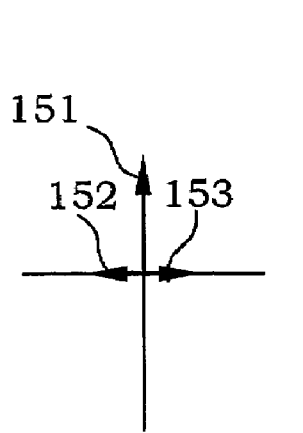 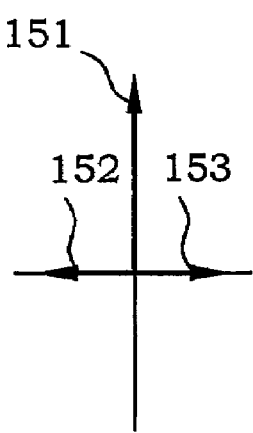 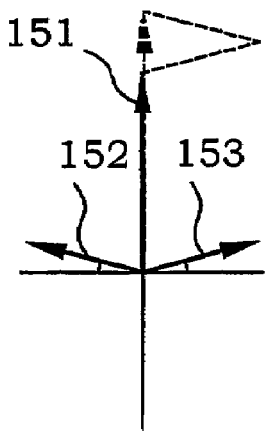
Fig. 7a    Fig. 7b    Fig. 7c
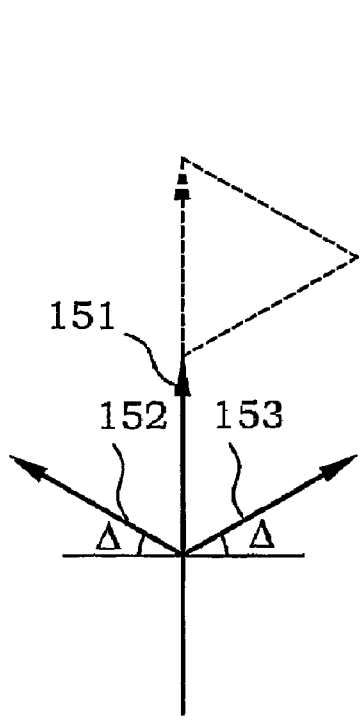 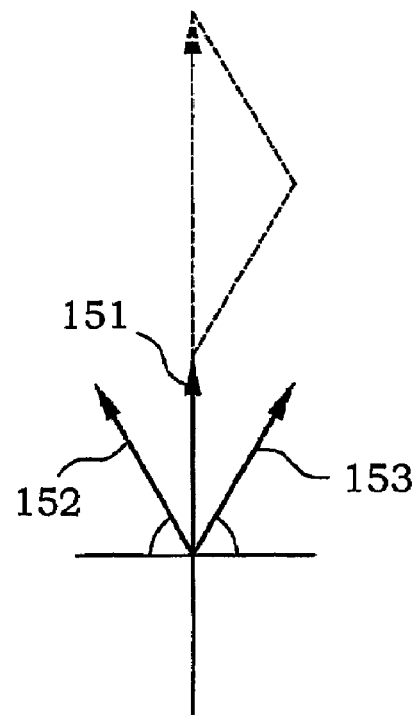
Fig. 7d    Fig. 7e

US 7,411,449 B2

COMPOSITE POWER AMPLIFIER

TECHNICAL FIELD

The present invention relates generally to power amplifiers and driving thereof, and in particular to composite power amplifier arrangements.

BACKGROUND

In many wireless communications systems, the power amplifiers (PA) in the transmitter are required to be very linear, in addition to being able to simultaneously amplify many radio channels (frequencies) spread across a wide bandwidth. They also have to do this efficiently, in order to reduce power consumption, need for cooling and to increase the lifetime of the amplifiers. The linearity is required to be good since non-linear amplifiers would cause leakage of interfering signal energy between the channels.

The amplitude probability density of a mix of sufficiently many independent radio frequency (RF) channels, or of a multi-user CDMA (Code Division Multiple Access) signal, tends to be close to a Rayleigh distribution having a large peak-to-average power ratio. In order not to compress the waveform the amplifier must be operated with the average power backed off from the peak power of the amplifier. Since a conventional RF PA (Power Amplifier), especially class B, generally has an efficiency proportional to its output amplitude, its average efficiency is very low for such signals.

Several methods to increase the efficiency of the RF power amplifiers when transmitting signals with large amplitude variations have been proposed. Composite power amplifiers are common solutions. Two widely used methods are Chireix outphasing and the Doherty technique. Both of these well-known methods are emanating from the 1930's and are briefly presented in basic power amplifier literature, e.g. [1]. In more recent years, Meinzer has proposed another solution sometimes referred to as PAMELA, see e.g. [2].

In Chireix outphasing, amplitude modulation is obtained by combining two phase-modulated constant-amplitude signals through a combiner network (c.f. e.g. FIG. 1). The efficiency of a Chireix amplifier can have two peaks at different output voltages, compared with one for a conventional class B amplifier. The location of the extra peak is selected by the design of the combining network.

The Doherty amplifier (c.f. e.g. FIG. 2) basically consists of two amplifying elements, where the first one operates linearly through the entire range, while the second only operates during signal peaks. The efficiency curve exhibits an extra peak as compared with a conventional class B amplifier. The voltage of this extra peak is determined by the relative sizes of the amplifiers together with the output network.

The PAMELA technique (c.f. e.g. FIG. 3) uses an uneven number of amplifiers connected to a load via impedance conversion circuits. The sum of the currents will generate a voltage over the load. The voltage on each amplifier is kept constant and as high as possible, except possibly at very low output voltages. By selecting compensation reactances of pairs of amplifiers, an extra efficiency peak (as compared with class B amplifiers) can be achieved at a chosen output voltage.

SUMMARY

Despite the relatively increased efficiency for such composite power amplifier arrangements, a general problem is that the efficiency is still to low for certain wireless communication system applications.

An object of the present invention is to provide highly linear wideband power amplifier arrangements and methods for driving them with improved efficiency. A further object of the present invention is to provide such amplifier arrangements, which are relatively easy to be tuned to high efficiencies at predetermined output voltage amplitudes.

The above objects are achieved by devices and methods according to the enclosed patent claims. In general words, a PAMELA-type of composite power amplifier is configured in such a way that a single power amplifier is operated at low output voltage amplitudes by prohibiting a pair of outphasing power amplifiers to produce any current. Preferably, at output voltage amplitudes above the maximum voltage of the single power amplifier, the pair of outphasing power amplifiers is taken into operation providing currents phase shifted by substantially 180 degrees. When also the outphasing power amplifiers reach their maximum voltages, an outphasing operation is performed.

The relative sizes of the power amplifiers can be selected in such a way that a first peak in the efficiency curve occurs at the low-voltage side relative to a peak of an expected amplitude probability density. By adapting the sizes of compensation reactances of the power amplifiers in the pair, an additional peak can be achieved in the vicinity of the peak, but on the high voltage side. A high average efficiency is thus achieved.

In applications where a high efficiency is required over a very wide output voltage interval, further extensions of the composite power amplifier can be used. The first power amplifier, operating alone at low output voltage amplitudes, can be extended to a Doherty amplifier arrangement. Furthermore, more than one pair of outphasing power amplifiers can be used, whereby one pair at a time is taken into operation, when successively increasing the output voltage amplitude.

The present invention has several advantages compared to prior art. The total efficiency of a well-adapted composite power amplifier according to the present invention is higher than for other prior art arrangements having the same number of power amplifiers. Furthermore, in order to tailor the efficiency curve according to different applications, the present invention presents easily adaptable parameters. Moreover, the present invention presents a flexible potential for extensions with additional power amplifiers, increasing the efficiency even further.

BRIEF DESCRIPTION OF THE DRAWINGS

The invention, together with further objects and advantages thereof, may best be understood by making reference to the following description taken together with the accompanying drawings, in which:

FIGS. 7a-e are phasor diagrams illustrating the operation of the composite amplifier of FIG. 6;

DETAILED DESCRIPTION

The present invention is mainly based on the arrangement principles of a PAMELA amplifier system, but have also some similarities with Chireix and Doherty systems. In order discuss these similarities and to emphasise the fundamental differences with prior art composite power amplifiers, pure Chireix, Doherty and PAMELA arrangements will first be discussed somewhat more in detail.

Figure 1:
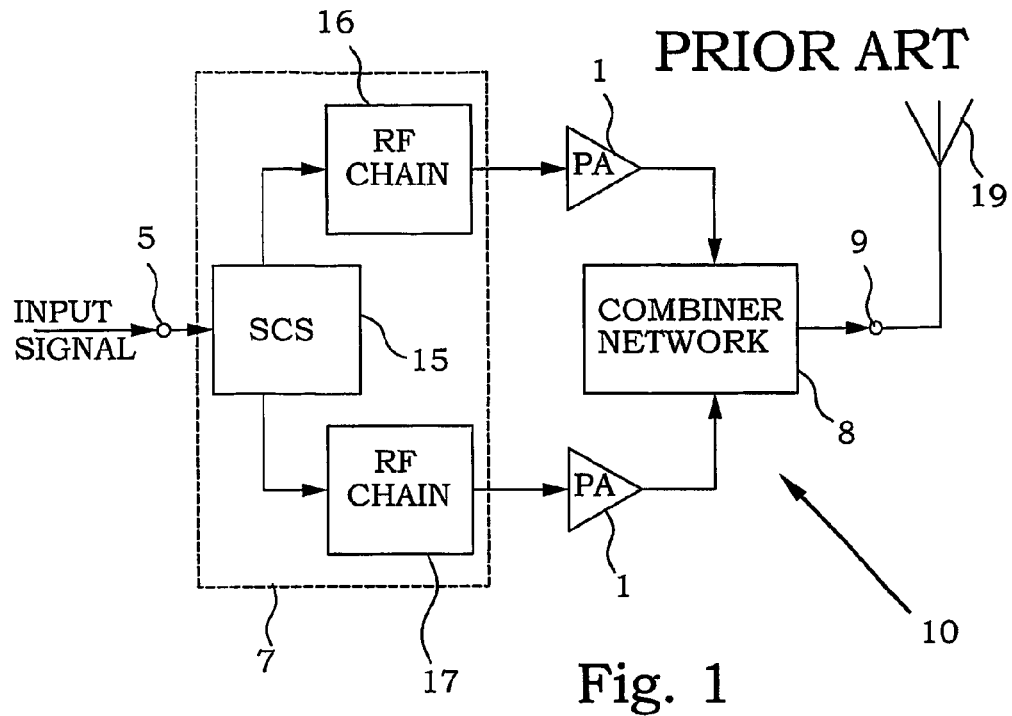
FIG. 1 is a block diagram of a Chireix composite power amplifier.

A typical Chireix amplifier 10 arrangement is illustrated in FIG. 1. The term "outphasing", which is the key method in Chereix amplifiers 10, generally means a method of obtaining amplitude modulation by combining several (generally two) phase-modulated constant-amplitude signals. A signal input 5 is connected to two power amplifiers 1 via a control network 7. The control network 7 of a Chireix amplifier 10 typically comprises a signal component separator 15, producing the phase-modulated constant-amplitude signals mentioned above. These signals are upconverted in mixer filters 16, 17, before being amplified in the power amplifiers 1. A combiner network 8 combines the individual amplified signals into an output signal, provided to a load output 9, in this example connected to an antenna 19. The phases of these constant-amplitude signals are chosen so that the result from their vector-summation in the Chireix combiner network 8 yields the desired amplitude. All amplitudes from zero to full amplitude, as well as negative amplitudes, can be obtained in this way.

The name Chireix is usually connected with the use of a non-dissipative output combiner network, otherwise the name LINC (LInear amplification with Non-linear Components) is used. A non-dissipative network is generally a requirement for high-efficiency operation.

In a recently published US patent application [3], an implementation variation of a Chireix arrangement is disclosed. Here, compensation reactances, typically used in Chireix arrangements, are replaced with lengthened and shortened transmission lines.

It is also possible, however, not yet publicly known, to build multi-stage Chireix systems with any even number of constituent amplifiers. This technique gives one extra efficiency peak per amplifier, and thus a higher total efficiency. Advantages over Doherty solutions are better theoretical efficiency and that the amplifiers can have more even sizes.

Figure 2:
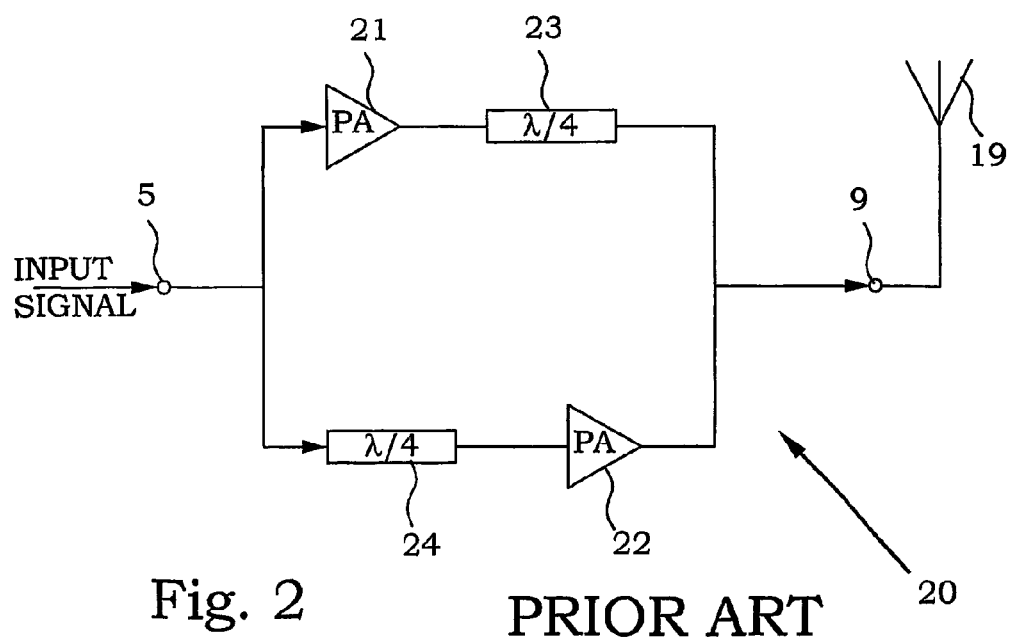
FIG. 2 is a block diagram of a Doherty composite power amplifier.

A Doherty amplifier arrangement 20 is illustrated in FIG. 2. The Doherty amplifier 20 comprises in a basic design two power amplifiers 21, 22. The first power amplifier 21 operates mainly linearly through the entire output voltage amplitude range. The second one 22 operates only during signal peaks. An impedance inverter 23 in the form of a quarter-wave transmission line on the output of the first power amplifier 21, transforms the load into a higher value, making the voltage on the first power amplifier 21 high (and the current low). In order to keep the first power amplifier 21 from saturating and to keep the output linear, the second power amplifier 22 injects a current during signal peaks. This current is transformed by the quarter wave transmission line to a voltage at the first power amplifier 21. This voltage is in anti-phase with the original voltage arising from current from the first power amplifier 21. The injected current is highly non-linear but is ideally not seen on the output, again because of the quarter-wave transmission line. An input transmission line 24 serves to make the phase of the second power amplifier 22 correct.

The most common way of generating the drive signals for a Doherty amplifier is the way shown in FIG. 2, where the second power amplifier 22 is biased in class C to keep it from generating any current at low levels. Another method disclosed in [4] uses separate generation of signals to the first and second power amplifiers 21, 22 in a control network, giving better control and possibilities to compensate for non-ideal networks.

The efficiency curve exhibits an extra peak. The voltage where this peak occurs is mainly determined by the relative sizes of the power amplifiers 21, 22 and can not be moved by changes in the output network for a given maximum output power. The Doherty technique can also be extended to three or more amplifiers, which gives more peaks in the efficiency curve, see e.g. [5].

One further possibility, based on the Doherty principle, but not yet publicly known, is to replace the individual amplifiers in the Doherty system with larger amplifier structures, such as e.g. Chireix amplifiers. This makes it possible to build very advanced systems, with the common attribute that they all have a single peak amplifier as a last stage, i.e. operating at the highest output voltages.

Figure 3:
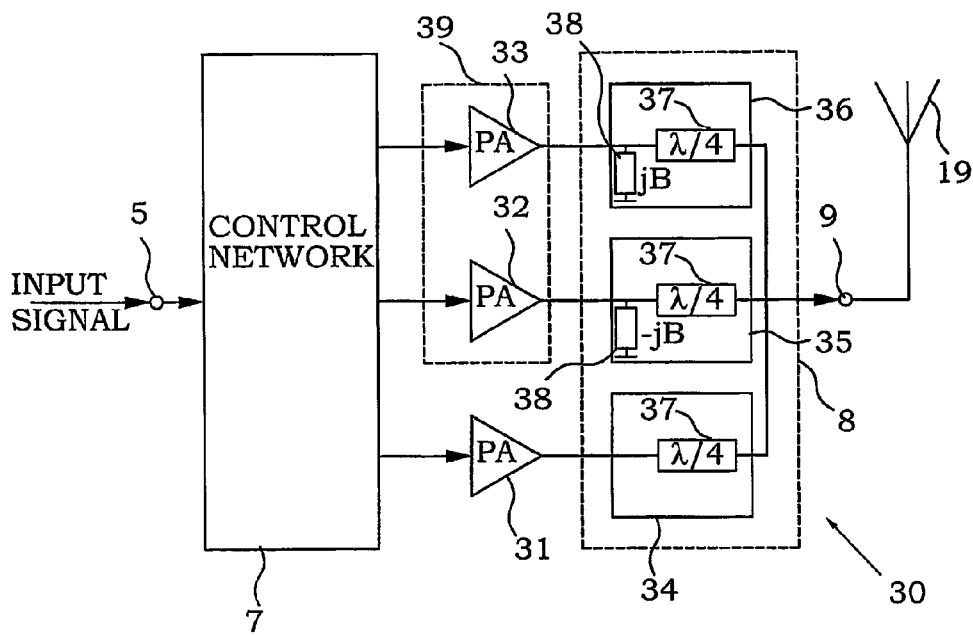
FIG. 3 is a block diagram of a prior-art PAMELA composite power amplifier.

A PAMELA amplifier system 30 is illustrated by FIG. 3, and uses several amplifiers 31-33 in a configuration that is somewhat similar to the one used in the Chireix technique. The number of amplifiers 31-33 is at least three and uneven. In FIG. 3, a system using three amplifiers is illustrated.

The amplifiers 31-33 are connected to the common signal input 5 via the control network 7. The outputs of the power amplifiers 31-33 are connected to a common load output 9 via a combiner network 8. This combiner network 8 comprises in the PAMELA configuration a respective impedance conversion circuit 34-36 between the output of each power amplifier 31-33 and the common load output 9. The power amplifiers 32 and 33 constitute a power amplifier pair 39, which is operated in close cooperation. The impedance conversion circuits 34-36 comprise a quarter-wave transmission line 37 each, i.e. an impedance inverter. The impedance inverters 35-36 further comprise compensation reactances 38, which have the same absolute magnitude, but of opposite signs.

Figures 4A, 4B, 4C, 4D:
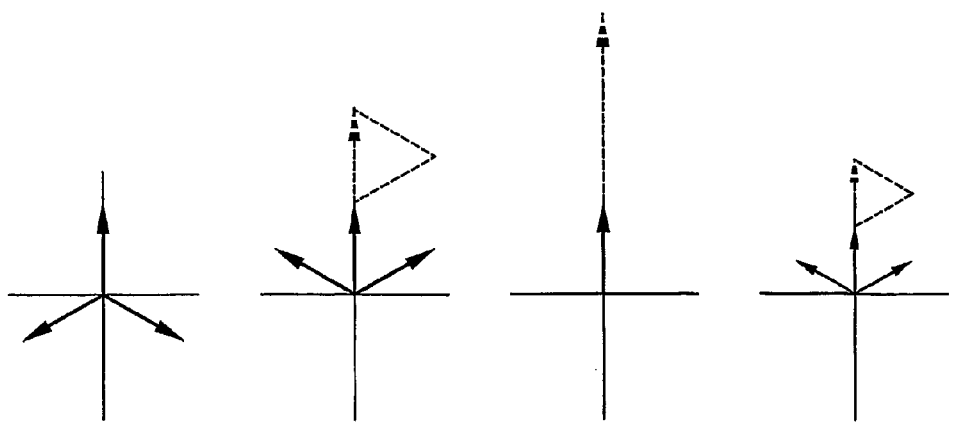
FIGS. 4a-d are phasor diagrams illustrating the operation of the composite amplifier of FIG. 3.

The voltages present on the amplifiers will be converted to currents by the impedance inverters. These currents will sum at the common output and generate a voltage over the load, in this case an antenna 19. The voltage on each amplifier is in a basic embodiment kept constant and as high as possible, and the output amplitude is regulated by adjusting the phases of the three amplifier voltages. This is schematically illustrated by FIG. 4*a-c*. FIG. 4*a* shows the amplifier voltage phasors for zero output amplitude, FIG. 4b shows the amplifier voltage phasors for medium output amplitude and FIG. 4c shows the amplifier voltage phasors for maximum output amplitude. By selecting the compensation reactances 38 correctly, it is possible to get an extra efficiency peak at a predetermined output voltage.

It is also possible to drive the amplifiers as ordinary linear amplifiers below a certain point, somewhere below the efficiency peak, to obtain better efficiency than with pure outphasing operation over the entire voltage range. FIG. 4d illustrates the amplifier voltage phasors for a low output amplitude in case of such a modified operation.

Figure 5:
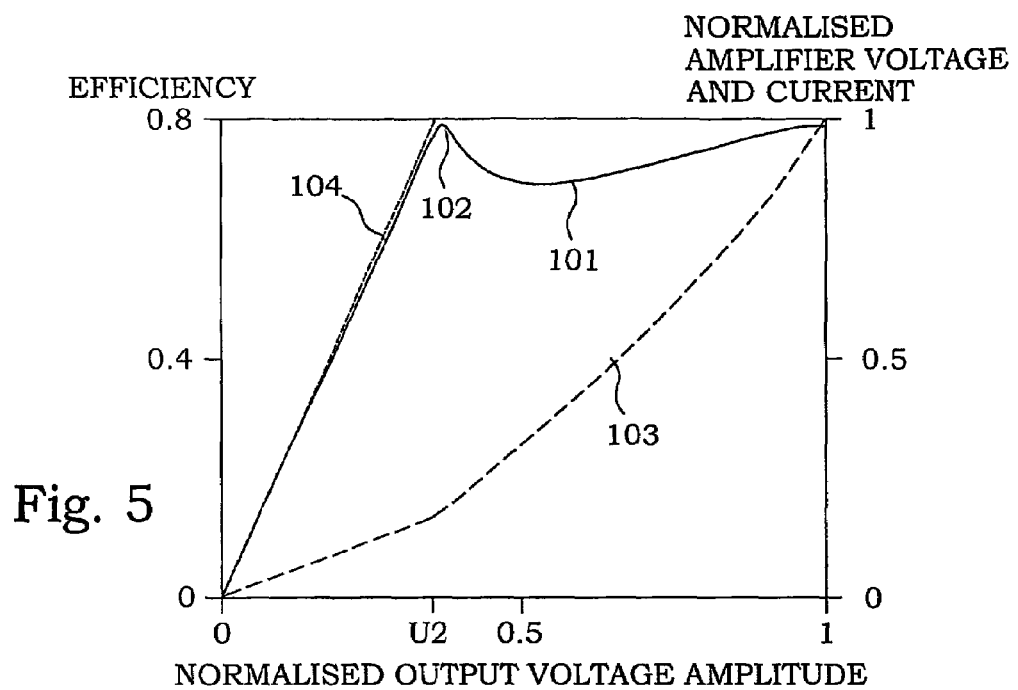
FIG. 5 is a diagram illustrating total efficiency, output current and output voltage of amplifiers of FIG. 3 as a function of momentary total output voltage amplitude.

FIG. 5 illustrates efficiency 101 versus output voltage for a typical PAMELA amplifier arrangement. The efficiency curve 101 exhibits one extra peak 102 compared to a single pure class B amplifier. The diagram in FIG. 5 also illustrates the sum of the amplitudes of the normalised amplifier currents 103 and voltages 104 of the three amplifiers. Below the output voltage U2, the voltages on the three amplifiers are increased, until reaching the maximum voltages at U2. Above this output voltage, the actual outphasing mechanism starts, i.e. keeping the voltages constant at their maximum on all power amplifiers, while changing their relative phases.

The differences between the PAMELA amplifier structure on one hand and the Doherty or Chireix structures on the other hand become obvious by comparing FIGS. 1, 2 and 3. In the PAMELA structure, each amplifier is connected to the output by an impedance conversion circuit, while the "peak" amplifier in a Doherty structure always has to be connected directly to the output. This is also true for combinations between Doherty and Chireix structures. In a Chireix structure, all amplifiers are associated in pairs, which are operated at opposite phasor angles, which means that a Chireix structure always has to involve an even number of amplifiers.

Figure 6:
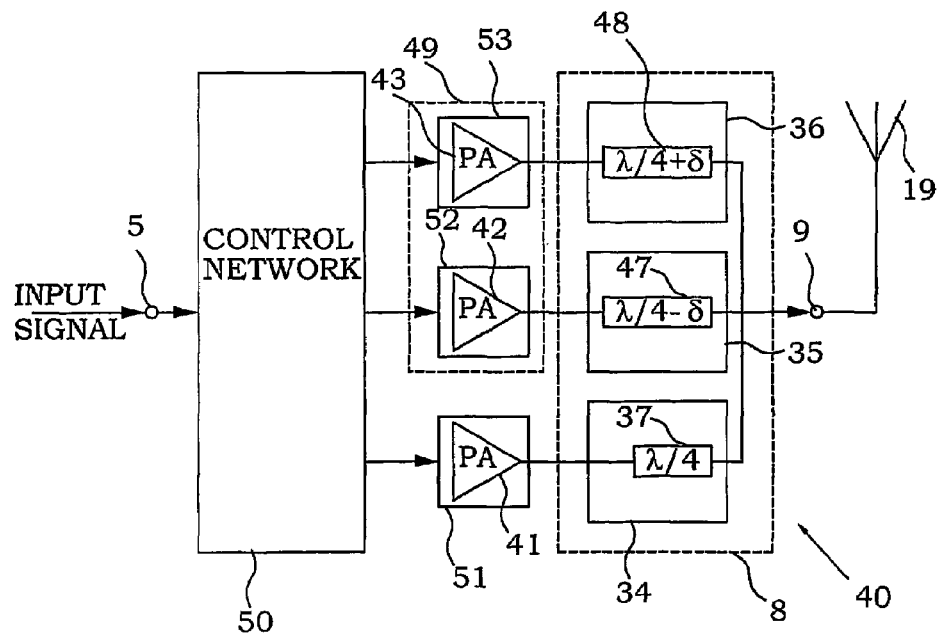
FIG. 6 is a block diagram of an embodiment of a composite power amplifier according to the present invention.

FIG. 6 illustrates a composite power amplifier 40 according to an embodiment of the present invention. A common signal input 5 is connected to inputs of three power amplifier entities 51-53 via a control network 50. The properties of the control network 50 will be discussed in more detail further below. The power amplifier entities 51-53 comprise in this embodiment one power amplifier 41-43 each. The outputs of the power amplifier entities 51-53 are connected via a combiner network 8 to a common load output 9, in turn connected to a load, in this embodiment an antenna 19. The combiner network 8 comprises one impedance conversion circuit 34-36 between the output of each power amplifier entity 51-53 and the common load output 9. The power amplifier entities 52 and 53 are associated with each other in a power amplifier entity pair 49 and are operated in cooperation, as discussed in detail further below.

The impedance conversion circuit 34 comprises an impedance inverter in the form of a quarter-wave transmission line 37. The impedance conversion circuit 35 comprises a shortened (−δ) transmission line 47, according to the ideas presented in [3]. Similarly, the impedance conversion circuit 36 comprises a lengthened (+δ) transmission line 48. These near-quarter-wave transmission lines 47, 48 have basically the same effect as the introduction of lumped elements, e.g. capacitors and inductors, and are examples of compensation elements. In another embodiments, the near-quarter-wave transmission lines 47, 48 could be substituted by quarter-wave transmission lines 37 and lumped elements, or any combination thereof.

The most important parts of the present invention are imbedded in the control network 50, and are best described by their corresponding functionality. The control network 50 comprises means 99 for determining a momentary amplitude of an input signal. This momentary input signal amplitude is in a typical case proportional to the desired momentary output voltage amplitude to be delivered by the composite power amplifier. At least there is an one-to-one association between an input signal amplitude and a corresponding output voltage amplitude. This means that by knowing one of the quantities, the other is also known. Depending on this momentary input signal amplitude or the corresponding momentary output voltage amplitude, the control network 50 operates the amplifier arrangement in different manners. The actual implementation of the control network 50 can then be made according to conventional analogue or digital techniques. In order to visualise the functionalities of the control network 50, let us follow an input signal that starts from zero and subsequently increases up to the maximum amplitude. Voltage phasor diagrams of different situations are illustrated in FIGS. 7a-e.

At low momentary input signal amplitudes, which also implies low output voltage amplitudes, the control network 50 operates the power amplifier entity 51 as a single operating linear power amplifier entity. This means that the control network 50 simultaneously prohibits the power amplifier entities 52, 53 of the power amplifier entity pair 49 to deliver any current at all. This can be performed by e.g. biasing the power amplifiers 42, 43 in class C, or by providing a zero input signal to the power amplifier entities 52, 53. The power amplifier entity 51 delivers a linear current that shows up as a voltage at the common load output 9. One effect of the quarter-wave transmission line 37 is to transform the load into some higher impedance, making the voltage at the power amplifier entity 51 rise quickly. A corresponding phasor situation is illustrated in FIG. 7a, where only the component 151 of power amplifier entity 51 contributes to the output power. Components 152 and 153 from the power amplifier entities 52 and 53, respectively, do not contribute to the output power.

When the voltage at the power amplifier entity 51 has reached its maximum, the efficiency of this power amplifier entity 51 is also at a maximum. A corresponding phasor situation is illustrated in FIG. 7b, where the component 151 has reached its maximum length.

When increasing the signal further, power amplifier entities 52 and 53 also start delivering current. The delivered currents have a constant phase difference of 180 degrees to each other and a phase difference of 90 degrees to the current of power amplifier entity 51. The effect of the currents from the power amplifier entities 52 and 53 is to keep the voltage on the power amplifier entity 51 from rising, i.e. keeping the power amplifier entity 51 from saturating, so it can continue to deliver more current. A corresponding phasor situation is illustrated in FIG. 7c, where components 152 and 153 of the power amplifier entities 52 and 53, respectively, becomes contributing.

At some point, also the voltages on the power amplifier entities 52 and 53 also reach the maximum. A corresponding phasor situation is illustrated in FIG. 7d, where components 152 and 153 have reached maximum length. The angles ±Δ of components 152 and 153 are results of the compensation reactance means, corresponding e.g. to any wavelength changes ±δ.

From this point, the power amplifier entities 52 and 53 operate in an outphasing mode, according to a traditional PAMELA arrangement, i.e. with constant voltage but varying angle. The power amplifier entity 51 continues to deliver linear current. A corresponding phasor situation is illustrated in FIG. 7e, where components 152 and 153 have changed relative angles. At maximum output voltage amplitude, the situation is the same as previously described in connection with FIG. 4c.

Anyone skilled in the art realises that there are large similarities between the prior-art PAMELA amplifier and certain embodiments of the present invention. In fact, by replacing the PAMELA control network 7 with a control network operating according to the control network 50 of FIG. 6, and adjusting certain component values, the amplifier arrangement of FIG. 3 can be used according to the present invention. However, anyone skilled in the art also realises that the functionality of the different control networks is so different that the appearance of the entire amplifier arrangement changes radically thereby.

Figure 8A:
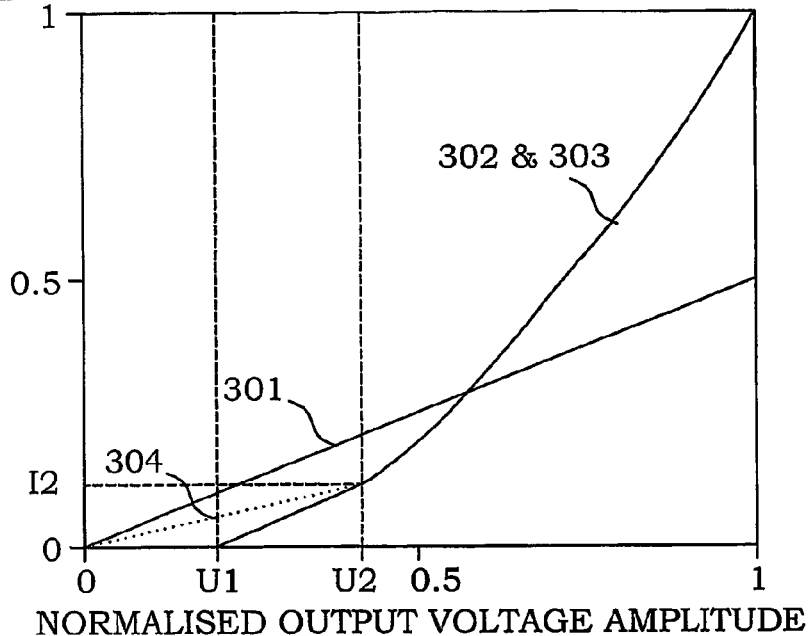
FIGS. 8*a-d* are diagrams illustrating amplitudes and phases of output currents and voltages from the individual amplifiers of FIG. 6 as a function of momentary total output voltage amplitude.
Figure 8B:
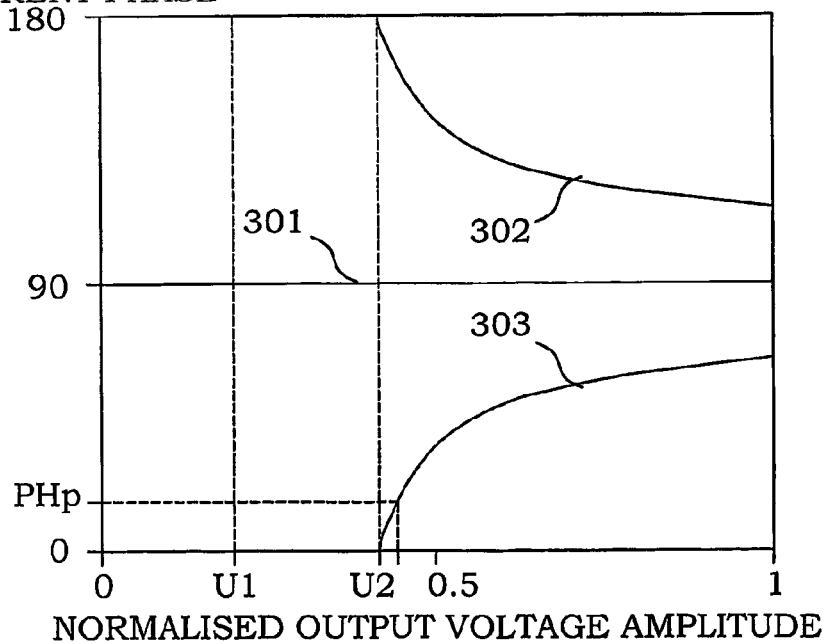
Figure 8C:
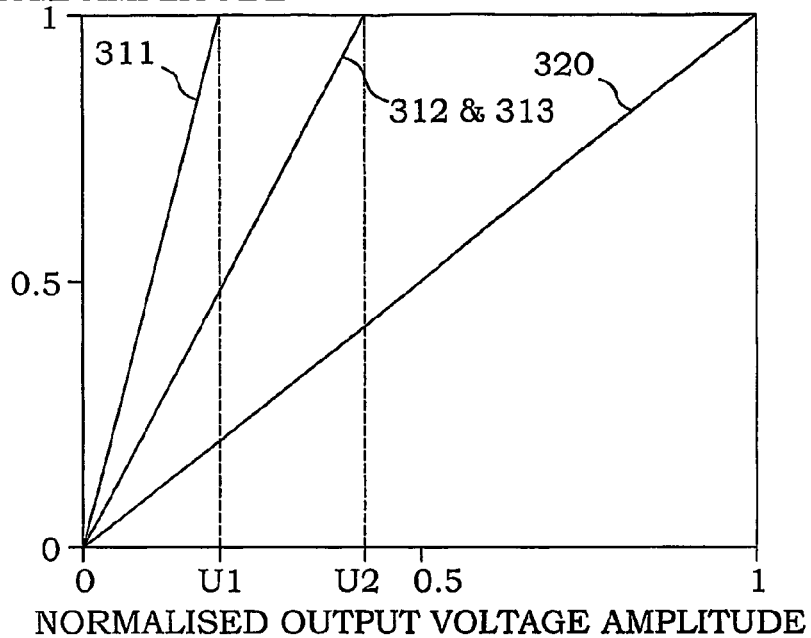
Figure 8D:
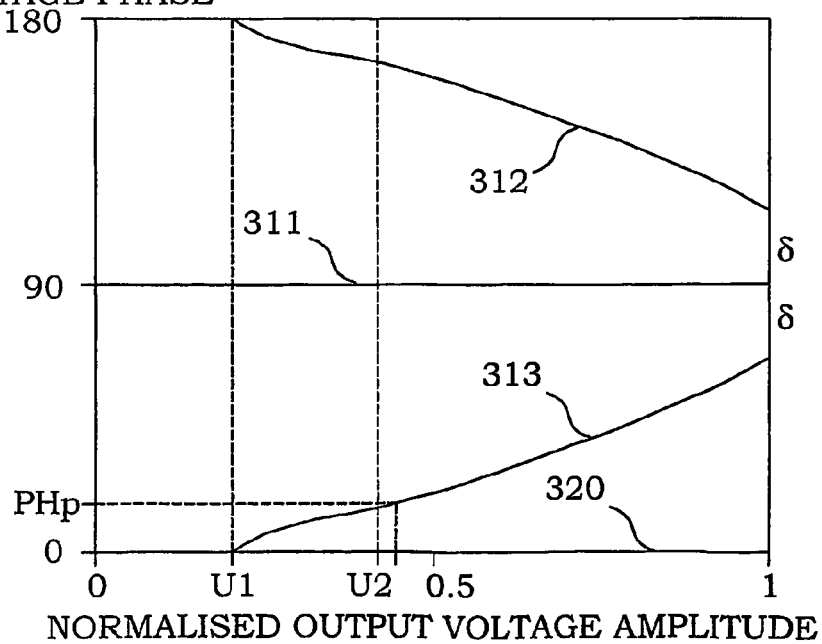

In order to further increase the possibilities to understand the operation according to the present invention, it is instructive to follow the amplitudes and phases of the outputs of the different amplifier entities corresponding to different output voltage amplitudes. FIGS. 8a and 8b shows the amplitude and phase of the currents delivered by the three amplifiers, while FIGS. 8c and 8d shows the resulting voltages (amplitude and phase) at the power amplifier entity nodes. Curve 301 represents the current from power amplifier entity 51, curve 302 represents the current from power amplifier entity 52 and curve 303 represents the current from power amplifier entity 53. Curve 311 represents the output voltage from power amplifier entity 51, curve 312 represents the output voltage from power amplifier entity 52, curve 313 represents the current from power amplifier entity 53 and curve 320 represents the total output voltage.

A first output voltage amplitude region is present between zero output voltage and a first predetermined output voltage amplitude U1. In this range, the current from power amplifier entities 52 and 53 are equal to zero. The current from power amplifier entity 51 instead increases linearly, as seen in FIG. 8a and with a constant phase, see FIG. 8b. Also the voltage on the power amplifier entity 51 output increases linearly (FIG. 8c) and with a constant phase (FIG. 8d). At U1, the voltage over power amplifier entity 51 has reached its maximum of the linear region. The output voltages of power amplifier entities 52 and 53 also increases linearly, but since no current is delivered, there will be no resulting output power.

When "maximum" voltages of amplifier entities or amplifiers are discussed, this refers to the maximum voltage of a linear region. In a typical case, it is indeed possible to increase the voltage or current even further, which will result in an increased output signal. However, the output signal will then no longer be linear with respect to the input signal. The maximum linear output voltage amplitude is thus to be considered as the break point between a linear amplification and a non-linear amplification. Above the maximum linear output voltage, a heavy distortion is typically provided.

It is also possible to position U1 below the maximum voltage of the power amplifier entity 51. If U1 is set to zero, a prior-art PAMELA arrangement will result. However, for efficiency reasons, it is according to the present invention preferred to set U1 substantially at the maximum voltage of the power amplifier entity 51, or at least to a non-negligible value.

A second output voltage amplitude region is present between the first predetermined output voltage amplitude U1 and a second predetermined output voltage amplitude U2. In this region, the current from power amplifier entities 52 and 53 increase linearly at substantially 180 degrees phase difference, ±90 degrees compared with the phase of the current from the power amplifier entity 51. These currents, as mentioned above, prohibits the power amplifier entity 51 from saturating, and the power amplifier entity 51 continues its linear increase of current. The voltages at the power amplifier entities 52 and 53 outputs have been increasing linearly since start, However, the phases of the voltages of the power amplifier entities 52 and 53, which have been constant at 180 degrees difference to each other during the first region starts now to vary. This variation is made in opposite directions and coordinated with each other so that the power amplifier entities 52 and 53 operate as a pair.

At U2, also the voltages over the power amplifier entities 52 and 53 have reached their maximum values. The U2 voltage is a maximum linear output voltage that can be achieved with the first, second and third amplifier entities 51-53 when the second and third amplifier entities 52, 53 deliver current with substantially 180 degrees phase difference. In FIG. 8a, a broken line 304 defines a linearly increasing current function between voltages from zero to U2. The current of this function is zero at zero output voltage and a minimum required current I2 at a momentary output voltage amplitude equal to U2. According to the present invention, the currents from the second and third power amplifier entities 52, 53 are restricted to be lower than the current function 304 at least for a part of the voltage interval up to U2. Preferably, this restriction goes substantially all the way up to U2, as is indicated in FIG. 8a. Furthermore, in a preferred embodiment, the output currents from the second and third power amplifier entities 52, 53 are essentially zero below U1. Such a current restriction will give rise to an enhanced efficiency.

A third output voltage amplitude region is present above the second predetermined output voltage amplitude U2 up to the maximum output voltage. In this range, the power amplifier entity 51 continues its linear increase in delivered current and at maximum voltage. The power amplifier entities 52 and 53 are operated at maximum voltage, but the phases of the delivered currents are now allowed to vary, according to a typical outphasing mode operation. Finally, at the maximum output voltage, all amplifiers are cooperating, giving signals in phase at the common load output. The remaining voltage and current phase of the power amplifier entities 52 and 53 at the maximum output voltage simply corresponds to the value of the δ.

Figure 9:
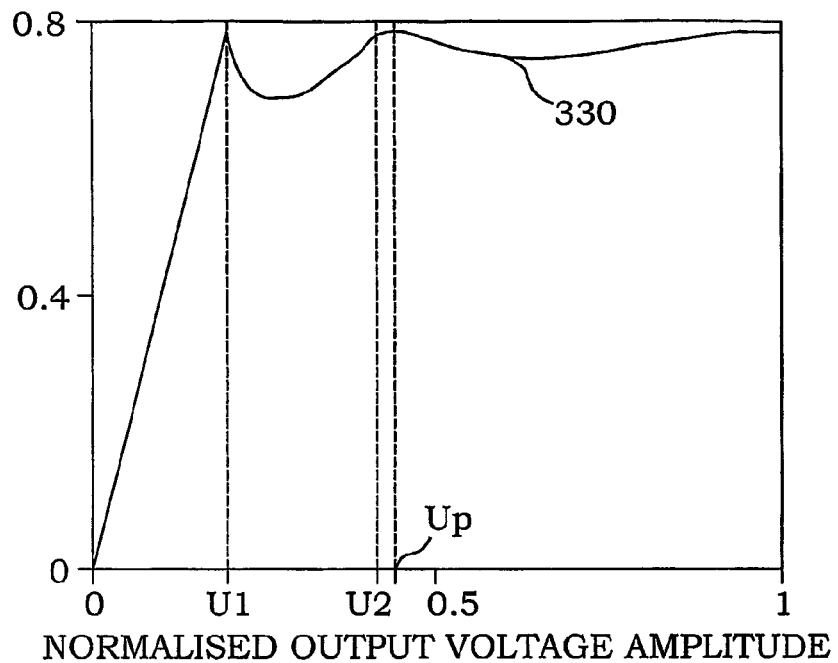
FIG. 9 is a diagram illustrating the efficiency of the composite power amplifier of FIG. 6, as a function of momentary total output voltage amplitude.

In FIG. 9, an efficiency curve 330 of the system described in FIG. 6 and FIG. 8a-d is illustrated. In the first output voltage amplitude region, the efficiency increases linearly, since only one power amplifier entity 51 is actively producing current. At U1, the efficiency reaches its maximum, 0.78 corresponding to a class B amplifier at maximum voltage, since the power amplifier entity 51 operates at maximum voltage and in phase with the current. Other values for the maximum efficiency are achieved if the power amplifiers are of other types, e.g. biased in class A or C. The position of the first efficiency peak coincides with the U1 position, which in turn is dependent on the transmission line impedances and the amplifiers relative size. In the embodiment presented in FIGS. 7-9, U1 was chosen to be at 0.2 of the maximum amplitude, which means that the transmission line should transform the load 5 times the optimal loadline impedance for the power amplifier entity 51. It also means that power amplifier entities 52 and 53 each will deliver twice as much power as power amplifier entity 51 at maximum output amplitude.

The size of the power amplifier entity 51, i.e. a maximum output power from the amplifier entity $P_0^{max}$, can be determined from the output voltage amplitude $V_P$, corresponding to an intended efficiency maximum, i.e. here equal to U1 by the simple relation:

$$P_0^{max} = P_{tot}^{max} \cdot \frac{V_P}{V_{out}^{max}},$$

where $P_{tot}^{max}$ is a total maximum output power of the entire composite power amplifier and $V_{out}^{max}$ is a total maximum output voltage of the entire composite power amplifier.

In the beginning of the second output voltage amplitude region, the total efficiency drops somewhat, due to the fact that the power amplifier entities 52 and 53 operates below their maximum voltage and furthermore that there is a phase difference between the output voltage and delivered current. Towards the end of the second output voltage amplitude region, the output voltages of the power amplifier entities 52 and 53 comes close to the maximum voltage. However, since the phase between voltage and current still differs, the efficiency at U2 is not the maximum one.

A careful reader notices that the second maximum of the efficiency curve of FIG. 9 appears at an output voltage Up, somewhat inside the third output voltage amplitude region. This maximum occurs when the changed current phase during the outphasing mode has reached the same phase as for the voltage, c.f. PHp in FIGS. 8b and 8d. The efficiency peak position Up is closely related to the U2 position. These positions are possible to adjust by varying the parameter δ. A larger δ will give an earlier peak position, i.e. a lower value of Up and U2. A smaller δ moves the peak and the transition point to the right in the diagram. In the present embodiment δ was chosen to be 0.07λ.

The dip in efficiency between Up and the maximum output voltage is explained by the phase difference between voltage and current of the power amplifier entities 52 and 53. Not until the maximum output voltage, the phases coincide again and a third efficiency peak is therefore present at maximum output voltage.

In the background, it was concluded that a typical amplitude probability density for multi-RF applications is close to a Rayleigh distribution. The overall efficiency of an amplifier arrangement is in principle the integral of the product of the amplitude probability density and the efficiency curve. It is thus important to design the amplifier according to the intended use. In the above discussion, it is seen that by adjusting the sizes of the power amplifiers and the design of the combiner network, the peaks in the efficiency curve can be modified. In one preferred embodiment, the first efficiency peak appears close to but somewhat below the amplitude probability density maximum. Similarly, the second efficiency peak is preferably positioned slightly above the amplitude probability density maximum. In another preferred embodiment, the first efficiency peak appears close to but somewhat below the expected output voltage value and the second efficiency peak is preferably positioned slightly above the expected output voltage value.

According to the relation presented above, the first power amplifier entity should be selected according to:

$$P_0^{max} < P_{tot}^{max} \cdot \frac{V_{PD}}{V_{out}^{max}},$$

where $V_{PD}$ is the voltage amplitude corresponding to the amplitude probability density maximum, the expected voltage value or any other quantity connected to the high-probability part of the amplitude probability density function for the actual application.

Figure 10:
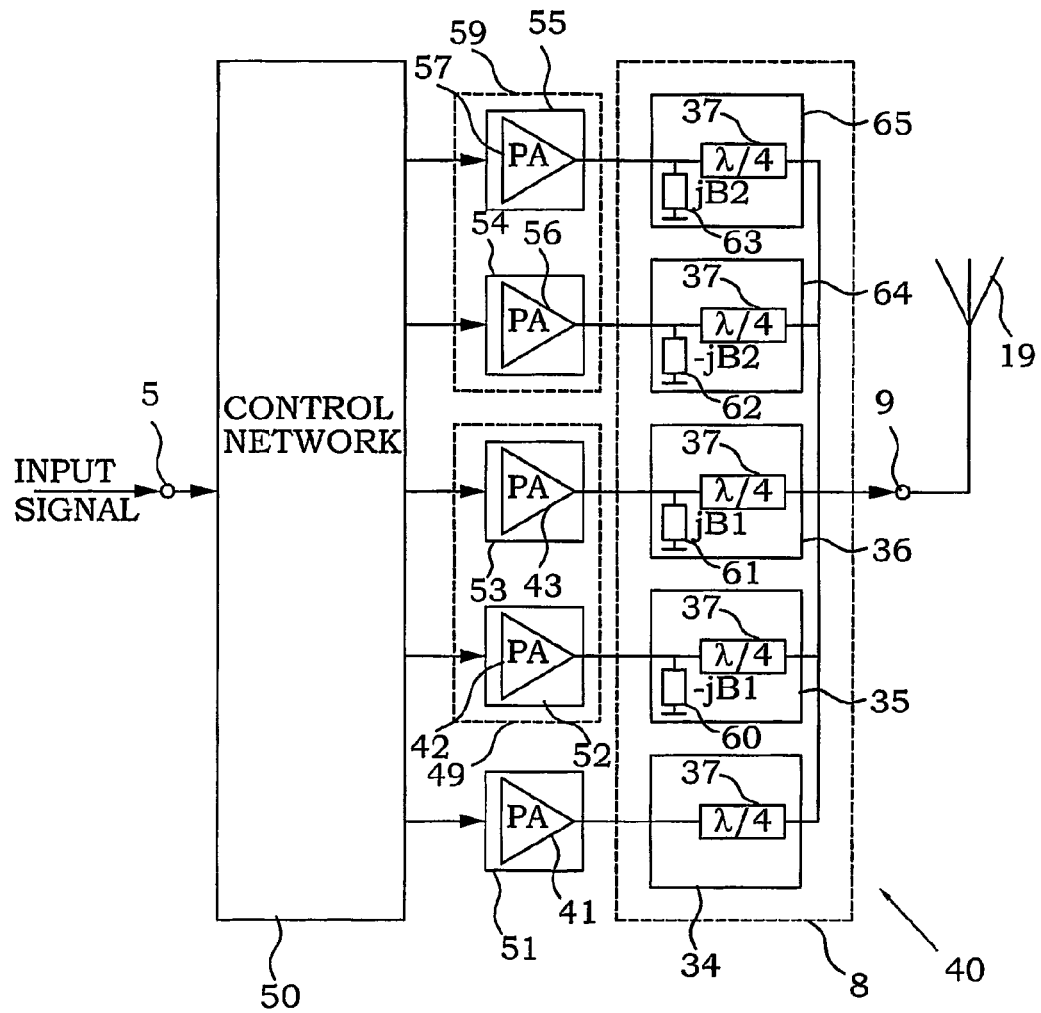
FIG. 10 is a block diagram of another embodiment of a composite power amplifier according to the present invention.

As mentioned before, the above described embodiment is based on a 3-amplifier PAMELA-like structure, however, arranged to operate in a different fashion. The present invention can, however, be extended in different aspects. FIG. 10 illustrates an embodiment of the present invention based on five amplifiers. Compared with FIG. 7, the amplifier arrangement of FIG. 10 has an extra power amplifier entity pair 59, comprising power amplifier entities 54 and 55, in turn comprising power amplifiers 56 and 57. The combiner network 8 comprises impedance conversion circuits 34-36, 64, 65, one for each of the power amplifier entities 51-55. In this embodiment, all impedance conversion circuits 34-36, 64, 65 includes an impedance inverter in the form of a quarter-wave transmission line 37 each. In order to produce the phase shifts of the power amplifier entity pairs 49, 59, compensation elements in the form of reactances 60-63 are included together within the impedance conversion circuits. The compensation reactances 60 and 61 have equal absolute size but opposite signs, and the compensation reactances 62 and 63 also have equal absolute size but opposite signs. The reactances 62 and 63, however, have generally a different size compared with the reactances 60 and 61.

When operating the amplifier arrangement of FIG. 10, the control network 50 is arranged to use only the power amplifier entity 51 for the lowest output amplitudes, just as in previous embodiments. When the maximum voltage is reached for this power amplifier entity 51, the first power amplifier entity pair 49 comes into use. In a first region, the voltage is increased up to the maximum voltage of the power amplifier entities 52 and 53, and then an outphasing mode continues. At even higher output voltage amplitudes, the second power amplifier entity pair 59 comes into operation. The output voltage over power amplifier entities 56 and 57 is increased, and when they reach their maximum values, another outphasing procedure starts.

In this manner, it is possible to extend the present invention further by adding extra pairs of power amplifier entities, driven in a Chireix-like manner. One pair at a time is taken into operation, and the outphasing mode of each pair occurs in different output voltage regions. The compensation reactances in the pairs, or similar compensation reactance means having the same basic function, are adjusted in order to give suitable transition points between the different operational phases of the amplifier arrangement.

Figure 11:
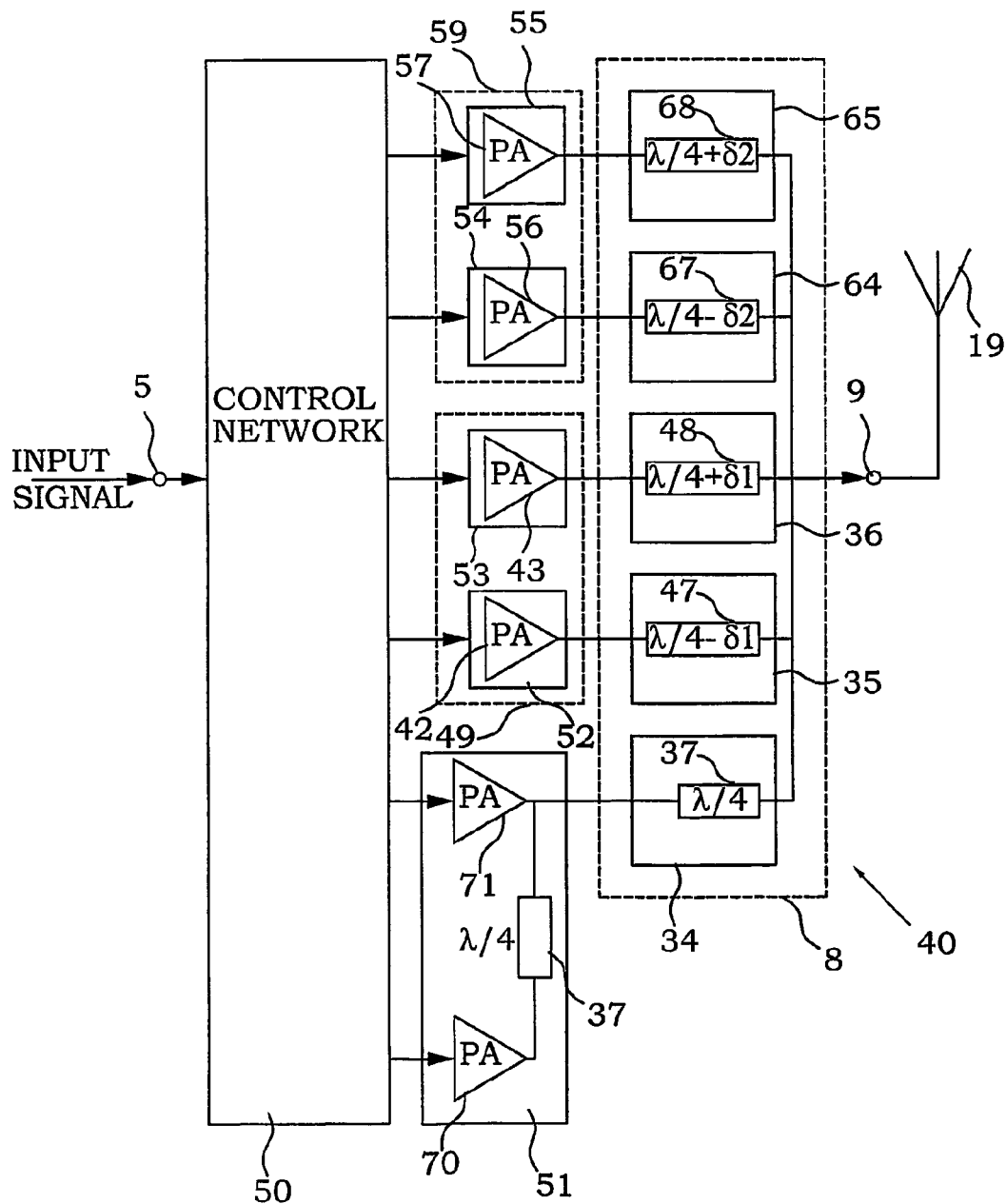
FIG. 11 is a block diagram of yet another embodiment of a composite power amplifier according to the present invention.
Figure 12A:
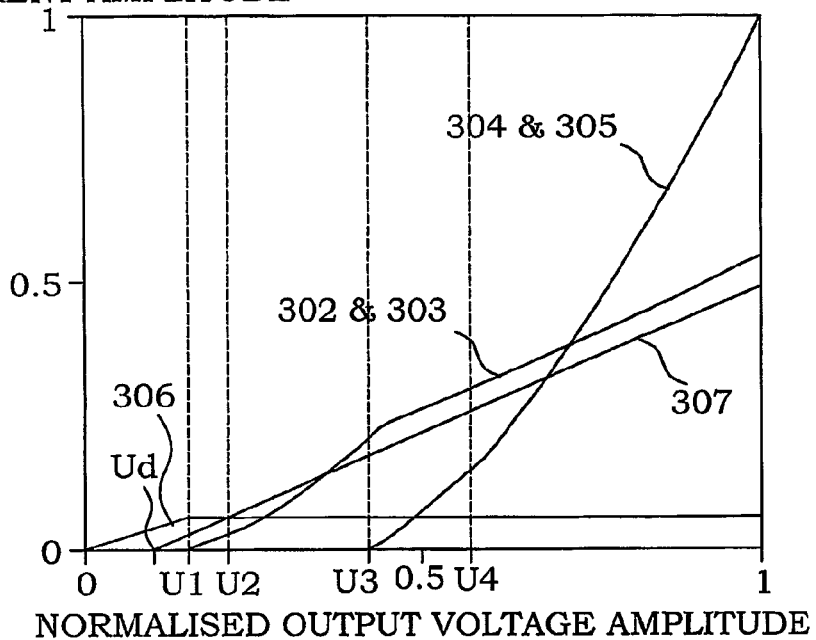
FIGS. 12*a-d* are diagrams illustrating amplitudes and phases of output currents and voltages from the individual amplifiers of FIG. 11 as a function of momentary total output voltage amplitude.
Figure 12B:
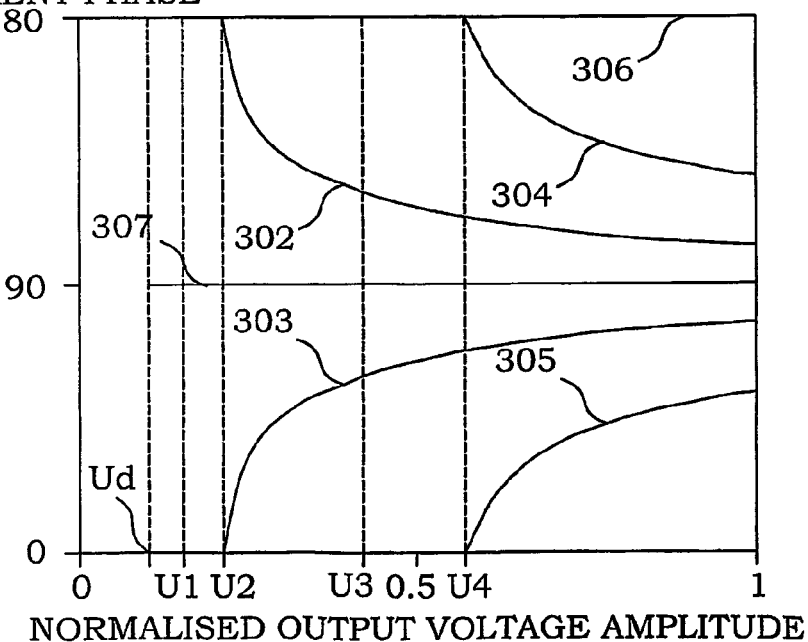
Figure 12C:
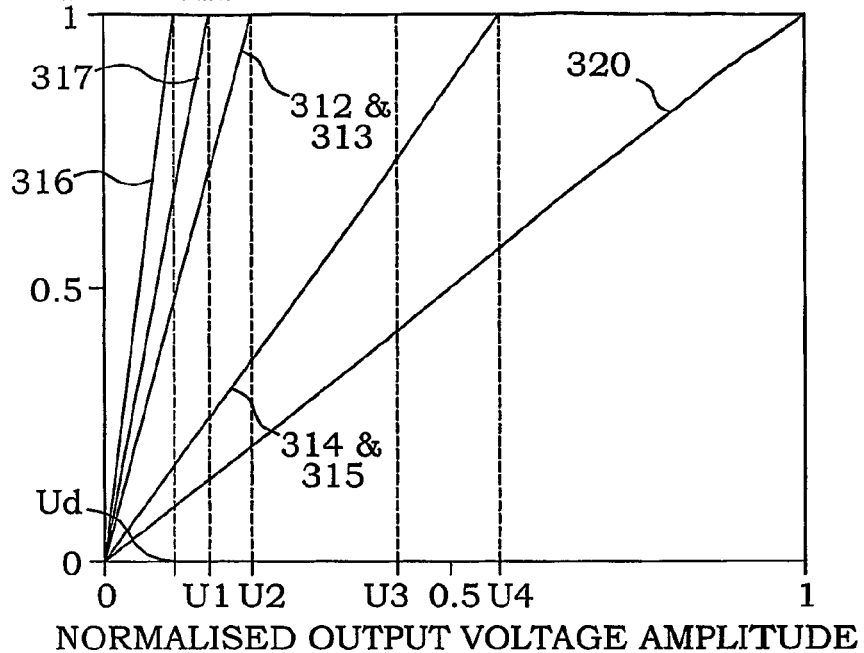
Figure 12D:
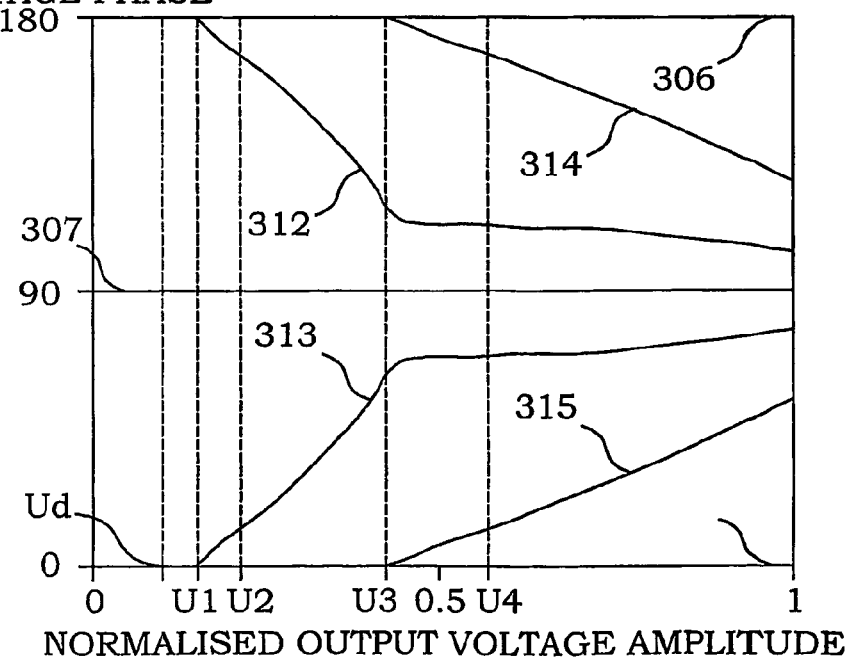

Also other extensions of the present invention are possible to perform. In FIG. 11, another embodiment of a composite power amplifier according to the present invention is illustrated. Also this embodiment has two pairs of Chireix-type power amplifiers entities 49, 59, which are operated in a similar manner as described before. In this embodiment, however, the compensation reactance means comprises shortened and lengthened transmission lines to give different phase shifts for the different pairs.

In FIG. 11, the first power amplifier entity 51 comprises an entire Doherty amplifier arrangement instead of a single power amplifier. A main power amplifier 70 of the first power amplifier entity 51 is used at the lowest output voltages to give a linear output via a quarter-wave transmission line 37. A peak amplifier 71 is used at somewhat higher output voltages to provide assistance according to normal Doherty operation.

The operation of the composite power amplifier according to FIG. 11 can be illustrated by amplifier voltage and current diagrams shown in FIGS. 12a-d. These diagrams are drawn in the same manner as FIGS. 8a-d. Curve 306 represents the current from power amplifier 70, curve 307 represents the current from power amplifier 71, curve 302 represents the current from power amplifier entity 52, curve 303 represents the current from power amplifier entity 53, curve 304 represents the current from power amplifier entity 54 and curve 305 represents the current from power amplifier entity 55. Similarly, curve 316 represents the output voltage from power amplifier 70, curve 317 represents the output voltage from power amplifier 71, curve 312 represents the output voltage from power amplifier entity 52, curve 313 represents the current from power amplifier entity 53, curve 314 represents the output voltage from power amplifier entity 54, curve 315 represents the current from power amplifier entity 55 and curve 320 represents the total output voltage.

Here, one notices that the main amplifier of the Doherty arrangement operates at its own at the lowest output voltages. At a transition point Ud, the peak amplifier of the Doherty arrangement starts to operate. At U1, the Doherty arrangement has reached its maximum operation and the first Chireix pair 49 comes into operation, first by increasing the voltages over the power amplifier entities, and above U2 by outphasing operations. At U3, the second Chireix pair 59 comes into operation and at U4, the second Chireix pair 59 starts its outphasing operation.

Figure 13:
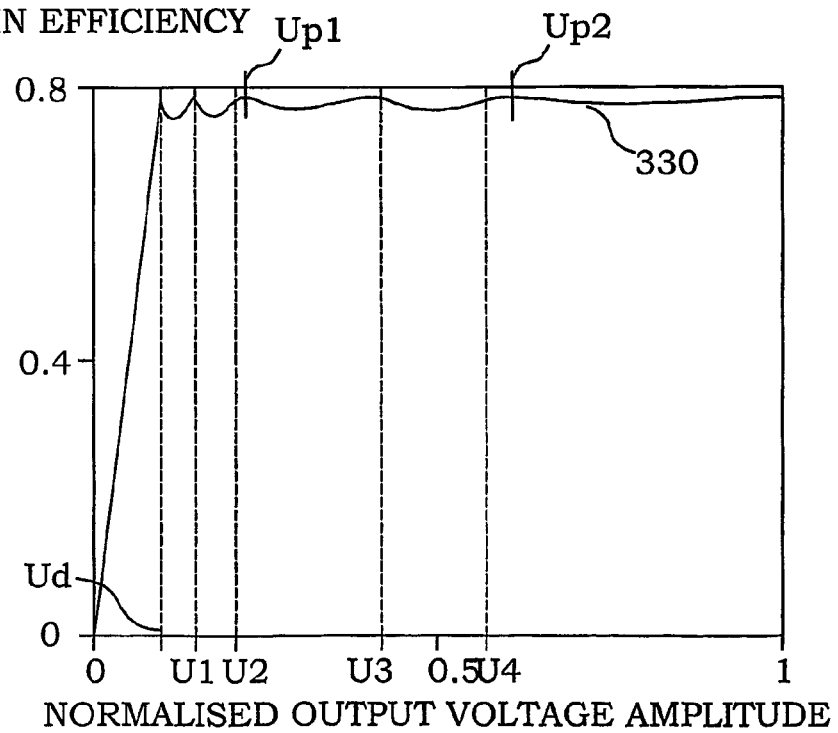
FIG. 13 is a diagram illustrating the efficiency of the composite power amplifier of FIG. 11, as a function of momentary total output voltage amplitude.

FIG. 13 illustrates a corresponding efficiency curve. One here notices that an additional peak appears at the low output voltage side of the previously appearing top at U1. This extra peak has its origin in the Doherty arrangement and coincides with the maximum voltage operation of power amplifier 70. The first Chireix peak appears at Up1, situated somewhat on the high output voltage side of U2, and is connected with the onset of the outphasing of the first Chireix-pair 49. The maximum operation of the first Chireix pair corresponds to the peak at U3. Another peak appears at Up2, close to U4 and is connected to the onset of the outphasing operation of the second Chireix pair 59.

The positions of the peaks can be tailored to suit the actual application by adapting the sizes of the power amplifiers and the values of the compensating elements used in the combiner network. In such a way, an extremely efficient composite power amplifier can be constructed.

Anyone skilled in the art realises that the amplifier structure proposed in the present invention can be further extended in different ways. More Chireix pairs can be added and Doherty arrangements can be used in the first power amplifier entity. Furthermore, such Doherty arrangements may also be extended to comprise more than one peak amplifier.

Figure 14:
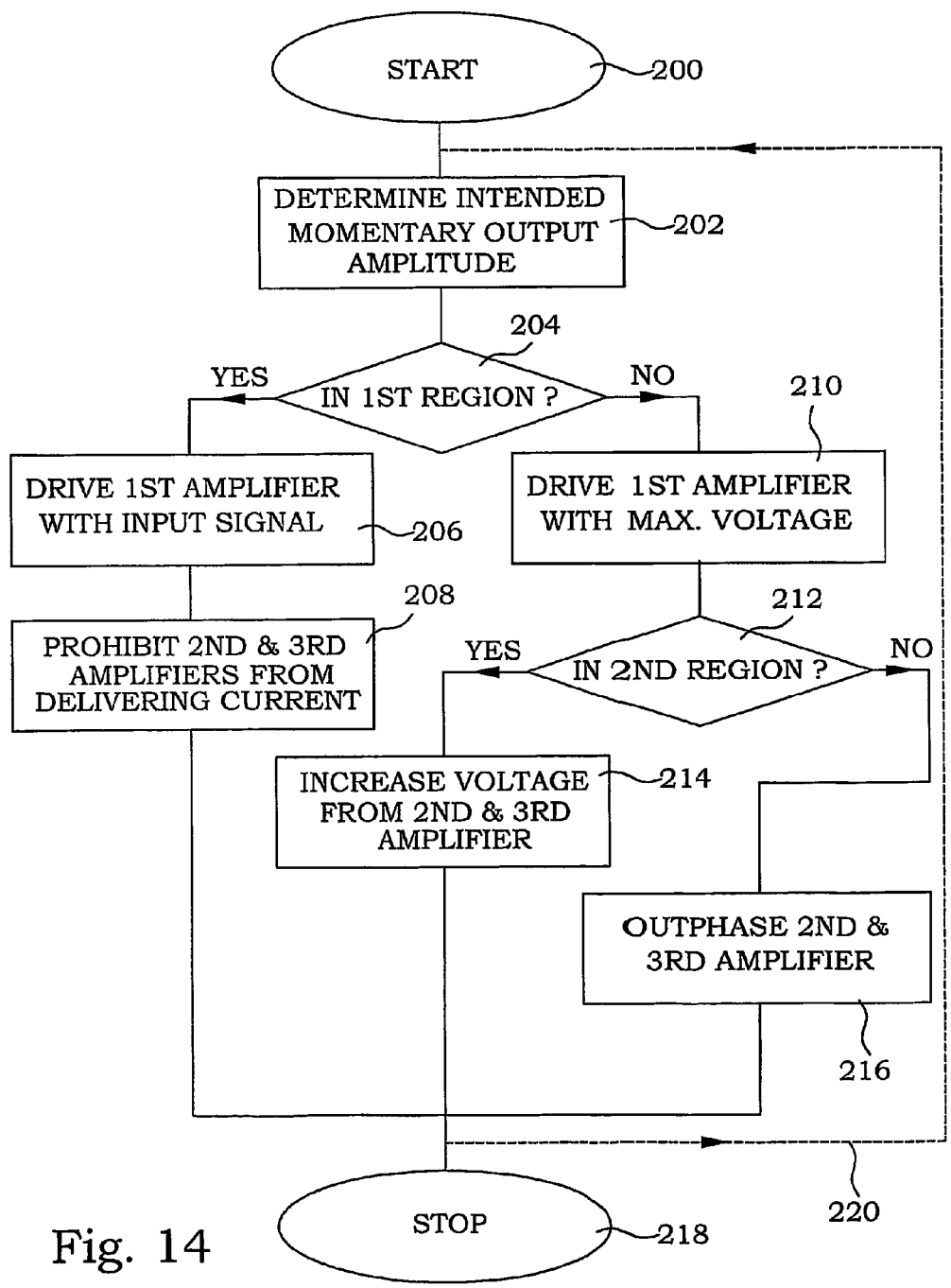
FIG. 14 is a flow diagram illustrating an embodiment of a method according to the present invention.

FIG. 14 illustrates the main steps of an embodiment of a method of driving a composite power amplifier according to the present invention. The procedure starts in step 200. In step 202, a momentary amplitude of an input signal of the signal input is determined. A corresponding output voltage amplitude is easily found, typically through a proportional relation. If, in step 204, it is concluded that the momentary output voltage amplitude is situated within a first output voltage amplitude region, the flow continues to step 206. The first output voltage amplitude region comprises all amplitudes below a non-zero, first predetermined output voltage amplitude. In step 206, a first power amplifier entity is driven by the input signal. In step 208, a second and third amplifier entity is instead prohibited to deliver any current. The flow continues to step 218.

If, in step 204, it is concluded that the momentary output voltage amplitude is not situated within the first output voltage amplitude region, the flow continues to step 210, where the first power amplifier entity is driven at its maximum output voltage. If, in step 212, it is concluded that the momentary output voltage amplitude is situated within a second output voltage amplitude region, the flow continues to step 214. The second output voltage amplitude region comprises all amplitudes between the first predetermined output voltage amplitude and a second predetermined output voltage amplitude. In step 214, the second and third amplifier entities are driven to deliver current with 180 degrees phase difference. The flow continues to step 218.

If, in step 212, it is concluded that the momentary output voltage amplitude is not situated within the second output voltage amplitude region, the flow continues to step 216, where the second and third amplifier entities are driven in an outphasing mode. The flow continues to step 218.

The procedure ends in step 218. Even if the procedure is described as a flow of steps, anyone skilled in the art understand that the steps are performed continuously, indicated by the broken arrow 220.

The main advantage of this invention, compared to prior art PAMELA amplifiers, is that the efficiency is higher. In the previous PAMELA systems, the amplifiers were not fully utilised to increase efficiency, with only two efficiency peaks no matter how many amplifiers were used. With the new drive method and device proposed, every amplifier contributes with one extra efficiency peak, making the system comparable to multi-stage Doherty or Chireix systems. The required drive power is also decreased, because amplifier current is reduced.

When compared to other multi-stage techniques, the present invention is a complement by making it possible to add Doherty-like efficiency peaks below all Chireix-type efficiency peaks.

It will be understood by those skilled in the art that various modifications and changes may be made to the present invention without departure from the scope thereof, which is defined by the appended claims.

REFERENCES

[1] Steve C. Cripps, "RF Power Amplifiers for Wireless Communications", Artech House Inc., Boston, 1999, pp. 225-246.
[2] U.S. Pat. No. 5,012,200.
[3] International patent application WO 03/061115.
[4] International patent application WO 02/05421.
[5] F. H. Raab, "Efficiency of Doherty RF Power Amplifier Systems", IEEE Transactions on Broadcasting, Vol. BC-33, No. 3, September 1987.

The invention claimed is:

1. A method of driving a composite power amplifier having a first power amplifier entity and a first power amplifier entity pair, in turn including a second and a third power amplifier entity, the first, second and third power amplifier entities being connected to a common signal input over a control network and to a common load output over a combiner network, the method comprising the steps of:
    determining a momentary amplitude of an input signal of the signal input and correlating the momentary input signal amplitude to a momentary output voltage amplitude; and
    driving the first power amplifier entity with the input signal; and,
    restricting the second and third power amplifier entities at momentary output voltage amplitudes below a first output voltage amplitude to deliver less current than a linearly increasing current function defined by zero current at zero momentary output voltage amplitude and a minimum required current at a momentary output voltage amplitude equal to a maximum linear output voltage that can be achieved with the first, second and third amplifier entities when the second and third amplifier entities deliver current with substantially 180 degrees phase difference;
        wherein the first output voltage amplitude is larger than zero but less or equal to the maximum linear output voltage that can be achieved with the first, second and third amplifier entities.

2. The method according to claim 1, wherein the first output voltage amplitude is substantially equal to the maximum linear output voltage.

3. The method according to claim 1, wherein the restricting step comprises the step of prohibiting the second and third power amplifier entities from delivering any substantial current at momentary output voltage amplitudes below a second output voltage amplitude smaller than the first output voltage amplitude.

4. The method according claim 1, further comprising the steps of:
   driving the first power amplifier entity at substantially maximum output voltage at momentary output voltage amplitudes above the second output voltage amplitude; and,
   driving the second and third amplifier entities to deliver current with substantially 180 degrees phase difference at momentary output voltage amplitudes between the second output voltage amplitude and the first output voltage amplitude on the common load output.

5. The method according to claim 4, wherein the combiner network in turn comprises a first, a second and a third impedance conversion circuit, respectively, whereby the second and the third impedance conversion circuit have compensation elements having substantially the same absolute value but of opposite sign.

6. The method according to claim 4, further comprising the step of:
   driving the second and third amplifier entities in an outphasing mode at momentary output voltage amplitudes above the first output voltage amplitude.

7. The method according to claim 1, wherein the composite power amplifier has at least one further power amplifier entity pair, whereby the method comprises the steps of taking each one of the at least one power amplifier entity pair in use at respective third output voltage amplitudes and driving the at least one further power amplifier entity pair so that they deliver no current below the respective third output voltage amplitude.

8. The method according to claim 7, further comprising the step of driving the at least one further power amplifier entity pair to deliver current with substantially 180 degrees phase difference at momentary output voltage amplitudes between the respective third output voltage amplitude and a respective fourth output voltage amplitude on the common load output.

9. The method according to claim 8, further comprising the step of driving the at least one further power amplifier entity pair in an outphasing mode at momentary output voltage amplitudes above the respective fourth output voltage amplitude.

10. The method according to claim 1, wherein the first power amplifier entity in turn comprises power amplifiers in a Doherty arrangement, whereby the step of driving the first power amplifier entity at momentary output voltage amplitudes below the second output voltage amplitude, in turn comprises driving the Doherty arrangement with the input signal of the signal input.

11. Composite power amplifier, comprising:
   a first power amplifier entity;
   a first power amplifier entity pair, in turn including a second and a third power amplifier entity;
   a common signal input;
   a control network connecting the common signal input and the first, second and third power amplifier entities;
   a common load output; and
   a combiner network, connecting the first, second and third power amplifier entity, respectively, to the common load output over at least one impedance conversion circuit;
   said control network in turn comprising means for determining a momentary amplitude of an input signal of the common signal input and relating the momentary input signal amplitude to a momentary output voltage amplitude;
   wherein the control network is further arranged for restricting the second and third power amplifier entities at momentary output voltage amplitudes below a first output voltage amplitude to deliver less current than a linearly increasing current function defined by zero current at zero momentary output voltage amplitude and a minimum required current at a momentary output voltage amplitude equal to a maximum linear output voltage that can be achieved with the first, second and third amplifier entities when the second and third amplifier entities deliver current with substantially 180 degrees phase difference; and,
   wherein the first output voltage amplitude is larger than zero but less or equal to the maximum linear output voltage that can be achieved with the first, second and third amplifier entities.

12. The composite power amplifier according to claim 11, wherein the first output voltage amplitude is substantially equal to the maximum linear output voltage.

13. The composite power amplifier according to claim 11, wherein the control network is arranged for prohibiting the second and third power amplifier entities from delivering any substantial current at momentary output voltage amplitudes below a second output voltage amplitude on the common load output smaller than the first output voltage amplitude.

14. The composite power amplifier according to claim 11, wherein said first power amplifier entity has a maximum output power $P_0^{max}$ selected according to:

$$P_0^{max} < P_{tot}^{max} \cdot \frac{V_P}{V_{tot}^{max}},$$

where $P_{tot}^{max}$ is a total maximum output power of all power amplifier entities, $V_{tot}^{max}$ is a maximum output voltage amplitude and $V_P$ is an output voltage amplitude corresponding to an intended efficiency maximum.

15. The composite power amplifier according to claim 11, wherein the control network is further arranged for driving the first power amplifier entity at substantially maximum output voltage at momentary output voltage amplitudes above the second output voltage amplitude and for driving the second and third amplifier entities to deliver current with substantially 180 degrees phase difference at momentary output voltage amplitudes between the second output voltage amplitude and the first output voltage amplitude on the common load output.

16. The composite power amplifier according to claim 15, wherein said combiner network in turn comprises a first, a second and a third impedance conversion circuit.

17. The composite power amplifier according to claim 16, wherein the second and the third impedance conversion circuits comprise compensation elements of substantially the same absolute value but of opposite sign.

18. The composite power amplifier according to claim 15, wherein the control network is further arranged for driving the second and third amplifier entities in an outphasing mode at intended momentary output voltage amplitude responses above the first output voltage amplitude.

19. The composite power amplifier according to claim 11, further comprising at least one further power amplifier entity pair.

20. The composite power amplifier according to claim 11, wherein the first power amplifier entity in turn comprises power amplifiers in a Doherty arrangement.

* * * * *